United States Patent
Menchetti et al.

[11] Patent Number: 5,803,971
[45] Date of Patent: Sep. 8, 1998

[54] MODULAR COATING FIXTURE

[75] Inventors: John William Menchetti, Hamden; Steven Michael Burns, Waterbury, both of Conn.

[73] Assignee: United Technologies Corporation, Hartford, Conn.

[21] Appl. No.: 782,398

[22] Filed: Jan. 13, 1997

[51] Int. Cl.[6] .......................... B05C 13/00; C23C 16/00; C23C 13/00
[52] U.S. Cl. .................. 118/500; 118/730; 118/720; 118/721; 118/504; 204/298.15; 427/251; 427/255.5; 427/425
[58] Field of Search ................................... 118/500, 504, 118/505, 720, 721, 730; 204/298.15; 427/251, 255.5, 425

[56] References Cited

U.S. PATENT DOCUMENTS

| | | | |
|---|---|---|---|
| 3,594,227 | 7/1971 | Oswald | 438/782 |
| 3,699,298 | 10/1972 | Briody | 219/634 |
| 3,796,182 | 3/1974 | Rosler | 118/725 |
| 3,865,072 | 2/1975 | Kirkman | 118/663 |
| 4,192,253 | 3/1980 | Aichert et al. | 118/712 |
| 4,252,626 | 2/1981 | Wright et al. | 204/192.15 |
| 4,271,005 | 6/1981 | Wright et al. | 204/298.15 |
| 4,496,828 | 1/1985 | Kusmierz et al. | 219/405 |
| 4,579,080 | 4/1986 | Martin et al. | 118/500 |
| 4,596,718 | 6/1986 | Gruner | 427/34 |
| 4,794,220 | 12/1988 | Sekiya | 219/10.491 |
| 4,823,736 | 4/1989 | Post et al. | 118/730 |
| 5,264,245 | 11/1993 | Punola et al. | 427/237 |
| 5,421,979 | 6/1995 | Stevenson | 204/298.25 |
| 5,630,879 | 5/1997 | Eichmann et al. | 118/720 |

FOREIGN PATENT DOCUMENTS

| | | | |
|---|---|---|---|
| 59-136541 | 7/1984 | Japan | 427/255.5 |
| 2-30695 | 2/1990 | Japan | 118/730 |
| 0457538 A1 | 11/1991 | Japan | 118/720 |

*Primary Examiner*—R. Bruce Breneman
*Assistant Examiner*—Jeffrie R. Lund
*Attorney, Agent, or Firm*—Bachman & LaPointe, P.C.

[57] ABSTRACT

The present invention relates to an improved fixture for facilitating the coating of workpieces such as turbine blades and vanes. The fixture has a hollow core member and a plurality of workpiece receptacles positioned along the length of and about the periphery of the core member. Each of the workpiece receptacles comprises an open sided workpiece support structure and a cover for closing the open side of the support structure. During the coating operation, the fixture of the present invention is rotated about its longitudinal axis while the workpieces being coated remain stationary within the receptacles.

24 Claims, 5 Drawing Sheets

MODULAR COATING FIXTURE

BACKGROUND OF THE INVENTION

The present invention relates to a novel modular fixture to be used in an apparatus for coating workpieces such as vanes and blades for industrial turbines and jet engines. The present invention also relates to a system and a method for using the novel modular fixture described herein.

Vanes and blades used in industrial turbines and jet engines are typically subjected to a coating operation to improve their resistance to corrosion, thermal fatigue, and to otherwise enhance their performance. In order to have an economically viable commercial process, it is necessary to coat multiple components at one time. U.S. Pat. No. 4,192,253 illustrates one such commercial system for simultaneously coating a plurality of components. In this system, a plurality of components to be coated are inserted into a coating chamber and simultaneously rotated about their longitudinal axes during the coating operation. The simultaneous rotation of the components about their longitudinal axes is accomplished by mounting each component to the tip of a fixture whose other end is connected to a complex gear operated drive system for rotating the fixture and the individual component mounted thereto. The principal disadvantages of this type of system are its complexity and the cost associated therewith. Yet another disadvantage is the delay incurred in individually removing coated parts from each of the fixtures and mounting new parts to be coated onto the fixtures.

SUMMARY OF THE INVENTION

Accordingly, it is a principal object of the present invention to provide a modular fixture which facilitates the simultaneous coating of multiple workpieces.

It is a further object of the present invention to provide a fixture as above which allows a more rapid part changeover.

It is still a further object of the present invention to provide a fixture as above which is economically viable.

It is yet a further object of the present invention to provide a system and a method for using the modular fixture of the present invention to coat workpieces such as turbine blades and vanes.

The foregoing objects are attained by the modular fixture of the present invention.

In accordance with the present invention, a fixture to be used with a coating apparatus broadly comprises a hollow core member and means for holding a plurality of workpieces to be coated affixed to the exterior surfaces of the core member. The fixture is further provided with means for enabling it to be mounted to a rotary drive shaft in a coating chamber.

The holding means comprise a plurality of receptacles in which the parts to be coated are placed. The receptacles are designed so that only those portions of the workpiece to be coated are exposed to the coating operation while the remaining portions of the workpieces are masked from the coating operation. Each receptacle is formed by a specially designed, open sided workpiece support structure or can and by a cover for closing the open side of the support structure. Each receptacle includes means for securing the cover to the support structure.

In operation, a plurality of workpieces to be coated are first placed in the receptacles attached to the core member and the covers are secured in place so that only the portions of the workpieces to be coated are exposed. The modular fixture with the workpieces mounted thereto is then placed on and secured to a rotary drive shaft within a coating chamber. The coating chamber is then closed and the coating operation commenced. During the coating operation, the drive shaft and the fixture are rotated while the workpieces remain stationary within the supporting receptacles. The fixture of the present invention differs from the aforementioned prior art system in that the coating of the workpieces is accomplished without individually rotating each of the workpieces about its own longitudinal or central axis. The type of coating provided by the fixture of the present invention has been termed "off axis" coating.

Other details of the fixture of the present invention and the manner in which it is installed and used in a coating apparatus, as well as other objects and advantages attendant to the present invention, are set forth in the following detailed description and the accompanying drawings in which like reference numerals depict like elements.

DETAILED DESCRIPTION OF THE PREFERRED EMBODIMENT(S)

Figure 1:
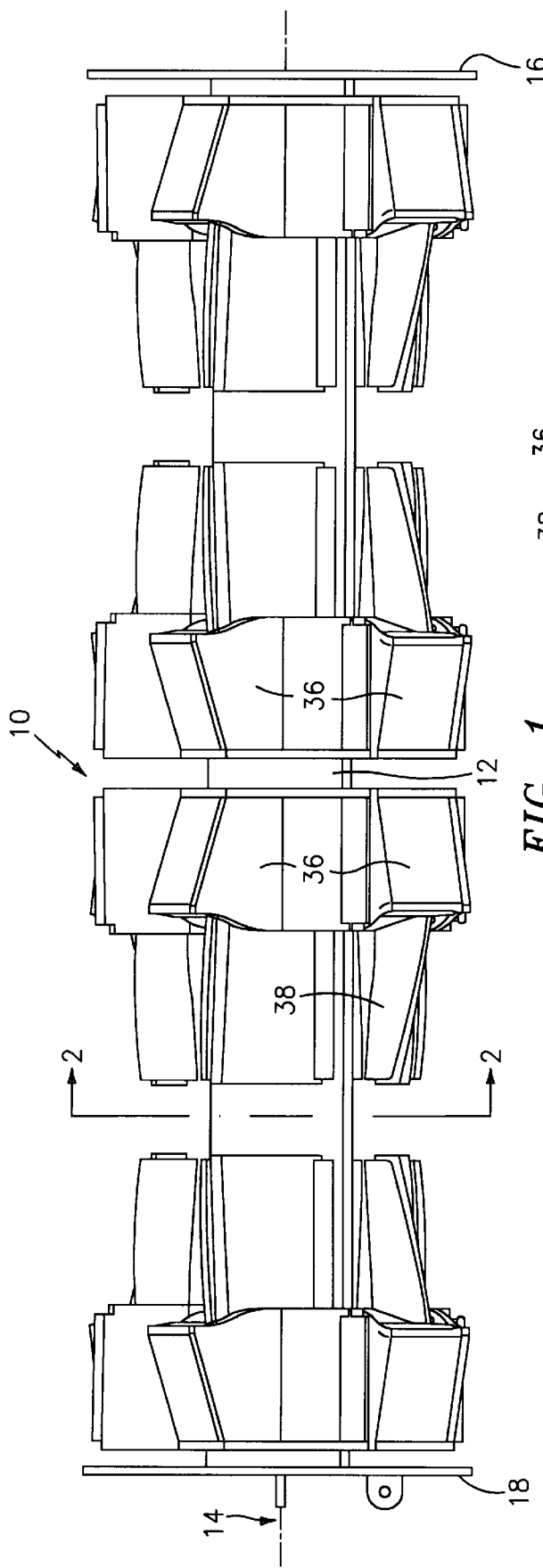
FIG. 1 is a perspective view of a modular fixture in accordance with the present invention.
Figure 2:
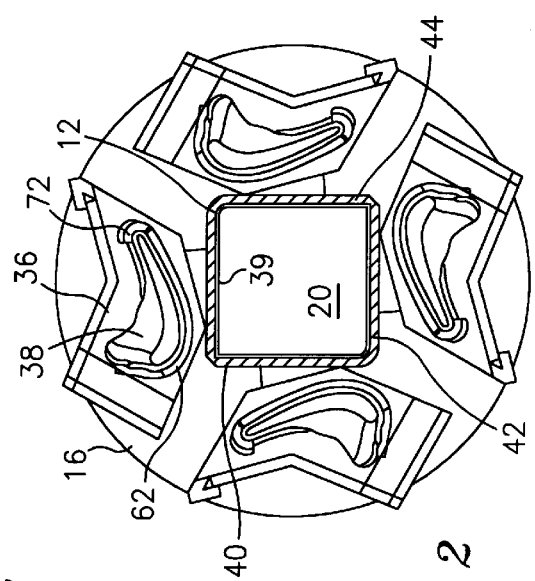
FIG. 2 is a sectional view of the modular fixture of FIG. 1 taken along lines 2—2.

Referring now to the drawings, FIG. 1 illustrates a modular fixture 10 in accordance with the present invention. The modular fixture 10 comprises a longitudinally extending core member 12 having a central axis 14 and end plates 16 and 18 affixed thereto. As shown in FIG. 2, the core member 12 includes a hollow interior channel 20 shaped to receive a rotary drive shaft 22 located within the coating apparatus.

The core member 12 may have any desired exterior shape. For example, the core member 12 could have a square or rectangular shape. Alternatively, the core member 12 could have a circular shape.

As previously discussed, the core member 12 has a hollow interior channel 20. The interior channel 20 is substantially coextensive with the length of the core member and has a cross sectional shape which corresponds to the shape of the rotary drive shaft 22 to which the fixture 10 is to be mounted.

Figure 3:
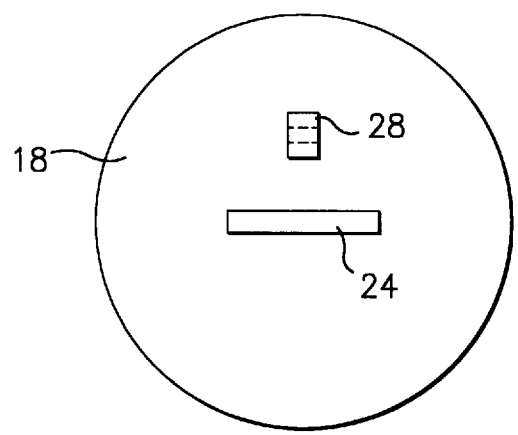
FIG. 3 is an end view of the modular fixture of FIG. 1.
Figure 4:
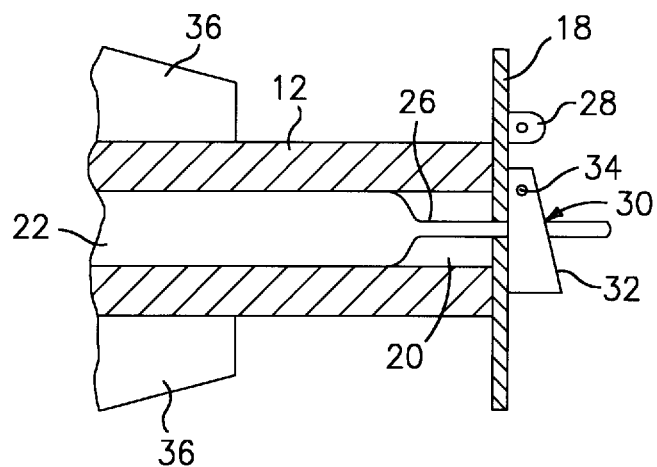
FIG. 4 is a cross sectional view of a portion of modular fixture of FIG. 1 illustrating the manner in which the fixture is connected to a rotary drive shaft within a coating chamber.

The end plates 16 and 18 are preferably circular in shape; although they may have any desired shape. As shown in FIG. 3, the end plate 18 differs from the end plate 16 in that it has a slot 24 for receiving a flattened end portion 26 of the drive shaft 22 and an eyelet 28. Referring now to FIG. 4, the flattened end portion 26 has an opening 30 in it for receiving a means 32 for securing the drive shaft 22 to the fixture 10. The securing means 32 preferably comprises a wedge having an opening 34 in it. The wedge 32 presses against the end plate 18 and is held in place by a piece of wire (not shown) which passes through the eyelet 28 and the opening 34.

The core member 12 and the end plates 16 and 18 may be formed from any suitable material known in the art.

A plurality of receptacles 36 are spaced along the extent of and around the periphery of the core member 12. As will be described hereinafter, each of the receptacles 36 holds an individual one of the workpieces 38 to be coated. The receptacles 36 are preferably formed from the same material as the core member 12 and are affixed to the exterior surfaces 39, 40, 42 and 44 of the core member 12. Any suitable means known in the art may be used to affix the receptacles 36 to the exterior surfaces 39, 40, 42 and 44. Preferably, the receptacles 36 are welded to the exterior surfaces of the core member 12.

Each receptacle 36 is formed by two components. The first component is an open-sided workpiece support structure 46, such as that shown in FIG. 5, for receiving the workpiece 38. The second component is a cover 48, such as that shown in FIG. 6, for closing the open side of the workpiece support structure 46. As can be seen from FIG. 5, the workpiece support structure 46 includes a bottom wall 50, two side walls 52 and 54 projecting from the bottom wall, a back wall 56 connecting the two side walls 52 and 54, and a partial top wall 58 shaped to correspond to the shape of one of the surfaces of the workpiece 38. The workpiece 38 to be inserted into the receptacle 36 is inserted as shown by arrow A through the open side.

Figure 5:
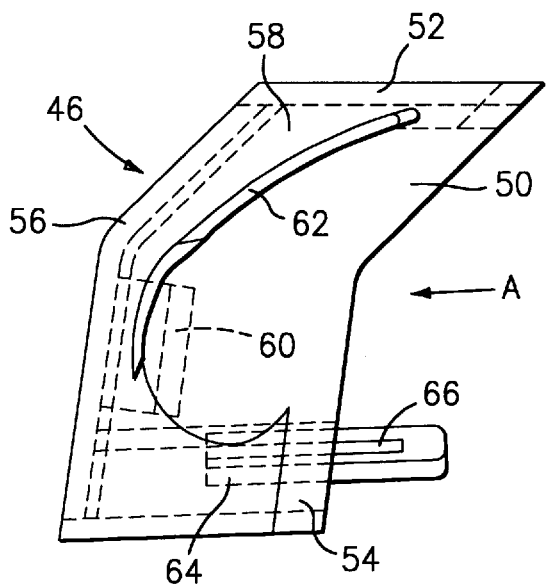
FIG. 5 is a top view of a workpiece support structure.

As shown in FIG. 5, the back wall 56 has a workpiece support 60 attached to it. The workpiece support 60 serves to align the root portion of the workpiece 38 within the workpiece support structure 46. During the coating operation, only certain portions of the workpiece 38 are to be coated. To insure proper coating, the top wall 58 is provided with a masking structure 62 extending from its outer surface. The masking structure 62 is shaped to correspond to the shape of a surface of the workpiece 38 to remain uncoated.

A tongue 64 is welded to the side wall 54. As shown in FIG. 5, the tongue 64 has a slot 66 for receiving a wedge 68 for securing the cover 48 in place.

Figure 6:
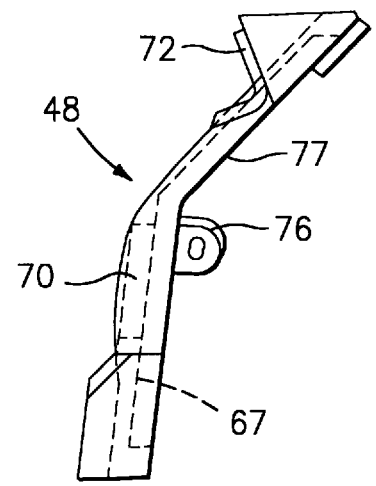
FIG. 6 is a top view of a cover for said workpiece support structure.
Figure 7:
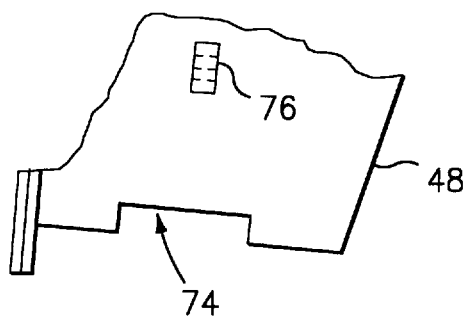
FIG. 7 is a partial front view of the cover of FIG. 6.

The cover 48 closes the open side of the workpiece support structure 46 and is shown in FIGS. 6 and 7. The cover 48 is formed from the same material as the support structure 46 and has an interior surface 67 shaped to substantially correspond to the shape of a second surface of the workpiece being coated. A workpiece support 70 is mounted to the interior surface 67 of the cover 48. The workpiece support 70 together with workpiece support 60 pinches the workpiece being coated and correctly positions it within the receptacle 36. As shown in FIG. 6, the cover 48 also has a masking device 72 attached to it. The masking device 72 may be secured to the cover 48 in any desired manner such as by welding. The masking device 72 prevents certain portions of the workpiece, such as the trailing edge of a turbine blade or vane, from being coated.

Figure 8:
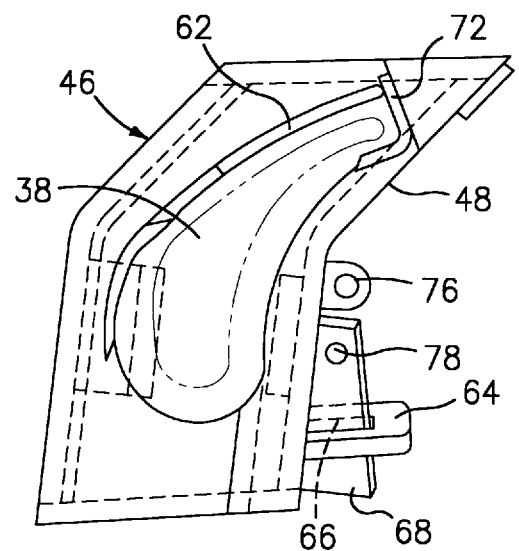
FIG. 8 is a top view showing the cover secured to the workpiece support structure.

The cover 48 further includes a slot 74 which fits over and accommodates the tongue 64. An eyelet 76 is mounted to the exterior surface 77 of the cover. When the cover 48 is positioned to close the support structure 46 as shown in FIG. 8, a wedge 68 having an opening 78 punched through it is inserted through the slot 66 in the tongue 64. The wedge 68 presses against the exterior surface 77 of the cover and causes the cover 48 to seal against the support structure 46. A piece of wire (not shown) is then passed through the eyelet 76 and the opening 78 to insure that the cover 48 is securely fastened to the support structure 46.

As shown in FIG. 4, the core member 12 when placed within a coating chamber (not shown) is positioned over a shaft 22 which is mounted to a drive system (not shown) for rotating the shaft 22 about its longitudinal axis. The drive system for rotating the shaft 22 may comprise any suitable drive system known in the art. The core member 12 is secured to the drive shaft 22 by allowing the flattened end portion 26 of the drive shaft to pass through the slot 24 in end plate 18 and by passing a wedge 32 through the opening 30 in the flattened end portion 26 and securing the wedge 32 to the eyelet 28 by a piece of wire.

The modular fixture of the present invention is used in the following manner. First, the workpieces 38 to be coated are placed within the workpiece support structures 46 of the receptacles 36. Then the covers 48 are placed over the open side of the workpiece support structures 46 and secured in place by passing wedges 68 through the slots 66 in the tongues 64 and by passing wires (not shown) through the openings 78 in the wedges 68 and the eyelets 76 fastened to the covers. Thereafter, the modular fixture 10, with the workpieces 38 in place, is placed onto a mounting device, in an extension of the coating chamber. The unit is transported into the coating chamber, such as an electron beam physical vapor deposition chamber, and secured to the drive shaft 22 which rotates the modular fixture 10 about its central longitudinal axis 14 during the coating operation. While the fixture 10 is rotated during the coating operation, the workpieces 38 themselves remain stationary within the receptacles 36. After the coating operation is completed, the modular fixture 10 with the workpieces 38 is removed from the chamber and a new fixture 10 with new workpieces to be coated is installed.

It can be seen from the foregoing description that the fixture of the present invention provides numerous commercial advantages. Most notably, the fixture allows the coating of multiple workpieces at one time. The fixture further allows easy placement of the workpieces therein and easy removal of the workpieces therefrom. Further, the workpieces may be placed within the fixture and removed from the fixture while another set of workpieces is being coated on yet another fixture. Still further, the fixture of the present invention is easier to use then prior art systems.

The fixture of the present invention has particular utility in coating airfoils such as turbine blades and vanes. When used to coat such airfoils, the masking structure 62 prevents coating of one surface of the airfoil and the masking device 72 prevents the coating of the trailing edge portion of the airfoil. In this way, only desired portions of the airfoils such as the leading edge and a single surface are coated.

Figure 9:
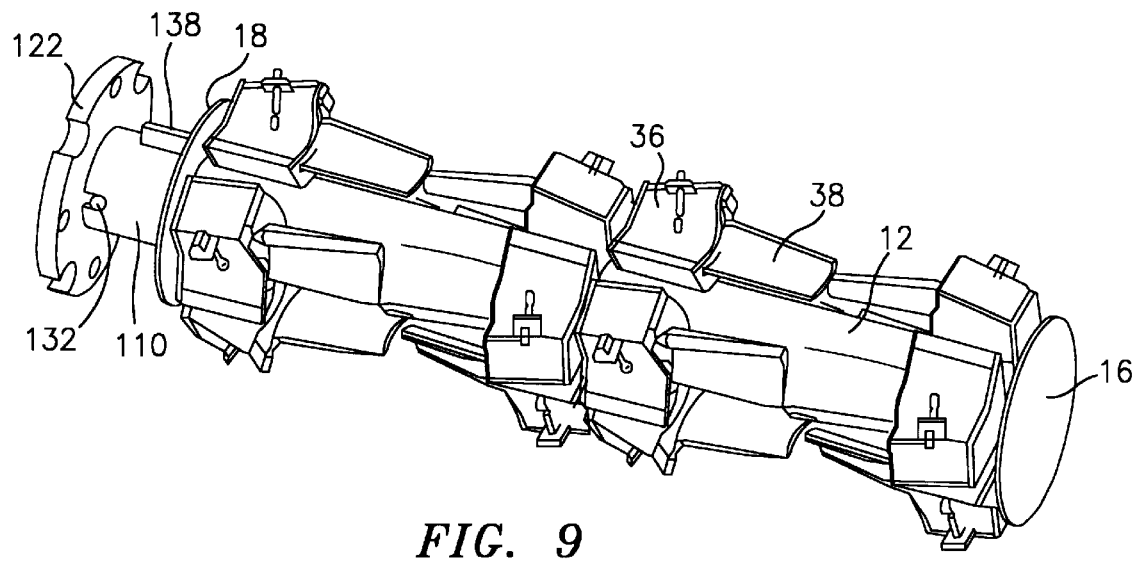
FIG. 9 is a perspective view of an alternative embodiment of a fixture in accordance with the present invention.
Figure 10:
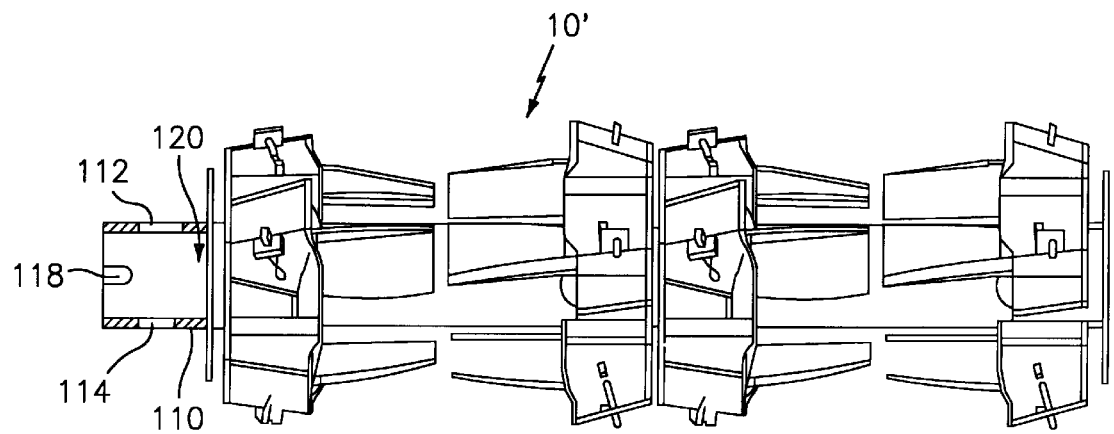
FIG. 10 is a side view of the fixture of FIG. 9, showing the hollow cylindrical member in section.

FIGS. 9 and 10 illustrate an alternative embodiment of a modular fixture 10' in accordance with the present invention. As before, the fixture 10' includes a core member 12, end plates 16 and 18, and a plurality of receptacles 36, spaced about and along the periphery of the core member, for holding workpieces 38 to be coated. The receptacles 36 are identical to those previously discussed.

The fixture 10' differs from the fixture 10 in the structure used to connect it to the rotary drive system. In this regard, the fixture 10' has a hollow cylindrical member 110 projecting from the end plate 18. The cylindrical member 110 is preferably made from the same material as the core member 12.

The cylindrical member 110 is characterized by two aligned slots 112 and 114 in its sidewalls and a keyway 118 adjacent the end opposed from the end plate 18. The member 110 is further characterized by an interior passageway 120 which is aligned with the interior channel 20 in the core member 12. The member 110 and the passageway 120 may have any desired cross-sectional shape. For example, both may be circular in cross section.

Figure 11:
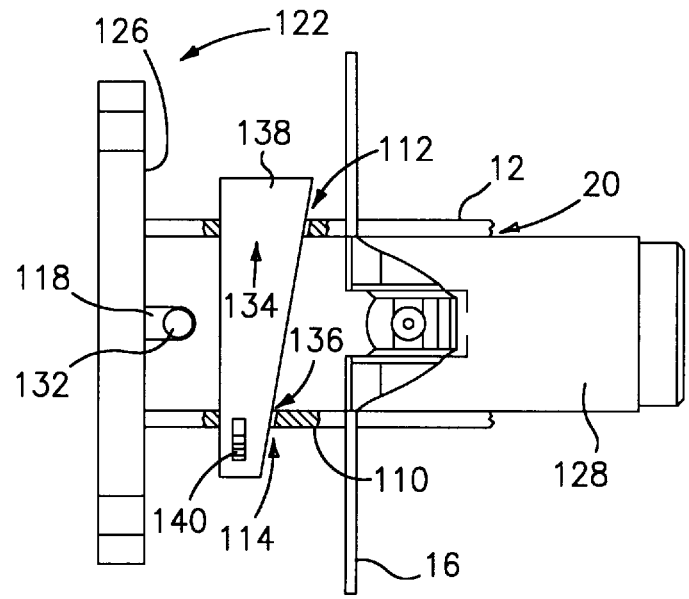
FIG. 11 is a view in partial section showing the fixture of FIG. 9 mounted to a base member.
Figure 12:
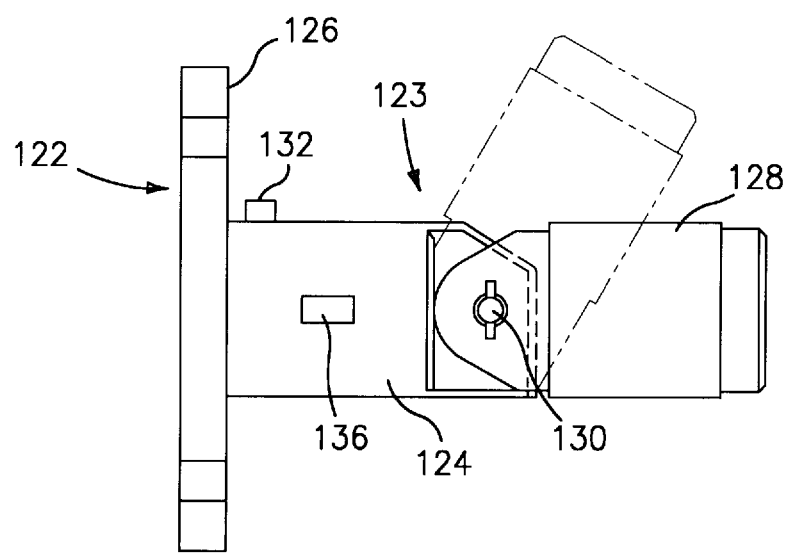
FIG. 12 is a side view of the base member.

FIGS. 10 and 11 illustrate a base member 122 to which the modular fixture 10' is secured. The base member 122 may be secured in any desired manner to the drive system (not shown) used in connection with a coating chamber (not shown) for rotating the fixture 10' about its central longitudinal axis. The base member 122 has a shaft 123 projecting from a base plate 126, which shaft includes a first portion 124 adjacent the base plate 126 and a second portion 128 which extends through the passageway 120 and into the interior channel 20. The portions 124 and 128 are preferably interconnected by a hinge arrangement which allows the portion 128 to rotate relative to the portion 124 in order to facilitate the loading of the fixture 10' onto the base member 122. The hinge arrangement 130 may comprise any suitable hinge arrangement known in the art.

The base member 122 is further characterized by a key member 132 protruding from one side of the first portion 124. The key member 132 fits within the keyway 118 and helps align slots 134 and 136 in the first portion 124 with the slots 112 and 114 in the cylindrical member 110. After the slots 134 and 136 have been aligned with slots 112 and 114, a wedge 138 is used to secure the cylindrical member 110, and hence the fixture 10', to the base member 122 and the rotary drive unit. If desired, a wire (not shown) could be passed through an opening 140 in the wedge 138 and through an opening (not shown) in the base member to secure the wedge 138 in place.

It has been found that the arrangement shown in FIGS. 9–12 is quite advantageous. First, it facilitates the loading of the fixture 10' into the coating chamber. Second, it allows for a very secure connection between the fixture 10' and the base member 122.

It is apparent that there has been provided in accordance with the present invention a modular coating fixture which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A fixture for use in a workpiece coating apparatus, said fixture comprising:
   a hollow cylindrical core member having an exterior periphery and a longitudinally extending central axis; and
   means for holding a plurality of workpieces to be coated, said holding means being directly affixed to said exterior periphery of said member so that surfaces of said workpieces to be coated are spaced from said exterior periphery and so that said workpieces can be coated by placing said fixture and said workpieces in said coating apparatus and rotating said fixture about said central axis while said workpieces being coated remain stationary within said holding means.

2. The fixture according to claim 1 further comprising said core member having a hollow interior channel for receiving a drive shaft for causing said fixture to rotate about said central axis and means for connecting said core member to a rotary drive shaft.

3. The fixture according to claim 2 wherein said hollow interior channel has a shape which corresponds to the shape of said drive shaft.

4. The fixture according to claim 1 wherein said holding means comprises a plurality of receptacles for receiving said workpieces to be coated and for exposing only desired portions of said workpieces to said coating operation.

5. The fixture according to claim 4 wherein said receptacles are spaced along the length of and about the periphery of said core member.

6. A fixture for use in a workpiece coating apparatus, said fixture comprising:
   a core member having an exterior periphery and a longitudinally extending central axis;
   means for holding a plurality of workpieces to be coated, said holding means being affixed to said exterior periphery of said member so that said workpieces can be coated by placing said fixture and said workpieces in said coating apparatus and rotating said fixture about said central axis while said workpieces being coated remain stationary within said holding means;
   said core member having a hollow interior channel for receiving a drive shaft for causing said fixture to rotate about said central axis and means for connecting said core member to a rotary drive shaft;
   wherein said hollow interior channel has a shape which corresponds to the shape of said drive shaft;
   said rotary drive shaft having a flattened end portion with an opening therein;
   an end plate attached to said core member, said end plate having a slot through which said flattened end portion passes and an eyelet; and
   said connecting means comprising a wedge capable of being inserted through said opening in said flattened end portion.

7. A fixture for use in a workpiece coating apparatus, said fixture comprising:
   a core member having an exterior periphery and a longitudinally extending central axis;
   means for holding a plurality of workpieces to be coated, said holding means being affixed to said exterior periphery of said member so that said workpieces can be coated by placing said fixture and said workpieces in said coating apparatus and rotating said fixture about said central axis while said workpieces being coated remain stationary within said holding means;
   wherein said holding means comprises a plurality of receptacles for receiving said workpieces to be coated and for exposing only a desired portions of said workpieces to said coating operation; and
   wherein each receptacle comprises an open sided workpiece support structure in which said workpiece is placed and a cover for closing the open side of said workpiece support structure.

8. The fixture according to claim 7 wherein said open sided workpiece support structure includes a top wall having a shape which substantially corresponds to the shape of one of the surfaces of said workpiece and means for masking said one surface of said workpiece attached to said top wall.

9. The fixture according to claim 8 wherein said open sided workpiece support structure further includes means for aligning said workpiece within said open sided workpiece support structure.

10. The fixture according to claim 7 wherein said receptacle further includes means for securing said cover to said open sided workpiece support structure.

11. The fixture according to claim 10 wherein said cover securing means comprises:
   a tongue member attached to a side wall of said open sided workpiece support structure, said tongue member having a slot therein;
   a slot in said cover for accommodating said tongue member; and
   a wedge passing through said slot in said tongue member and abutting against the outer surface of said cover.

12. The fixture according to claim 7 further comprising a masking device mounted to said cover, said masking device preventing portions of said workpiece from being coated.

13. A fixture for use in a workpiece coating apparatus, said fixture comprising:
   a core member having an exterior periphery and a longitudinally extending central axis;
   means for holding a plurality of workpieces to be coated, said holding means being affixed to said exterior periphery of said member so that said workpieces can be coated by placing said fixture and said workpieces in said coating apparatus and rotating said fixture about said central axis while said workpieces being coated remain stationary within said holding means;
   an end plate affixed to said core member; and
   means for affixing said fixture to means for rotating said fixture, said affixing means comprising a hollow cylindrical member projecting from said end plate.

14. The fixture according to claim 13 further comprising:
   said hollow cylindrical member having an interior passageway;
   said rotating means including a base member having a shaft protruding therefrom; and
   said shaft mating with said interior passageway.

15. The fixture according to claim 14 further comprising:
   said shaft having a first portion and a second portion; and
   said second portion being connected to said first portion by a hinge arrangement which allows the second portion to be rotated relative to the first portion to facilitate loading of said fixture thereon.

16. The fixture according to claim 14 further comprising:
   means for securing said cylindrical member to said shaft, said securing means including a pair of aligned slots in said hollow cylindrical member, a pair of aligned slots in said shaft, and a wedge which extends through said slots.

17. The fixture according to claim 16 further comprising:
   a key on said shaft; and
   a keyway in said cylindrical member for mating with said key and thereby aligning said slots in said member with said slots in said shaft.

18. A modular fixture for facilitating the simultaneous coating of a plurality of airfoils, said modular fixture comprising:
   a tubular member having an exterior periphery;
   a plurality of workpieces receptacles affixed to said exterior periphery for holding said airfoils,
   each of said receptacles comprising an open sided support structure for receiving an individual airfoil, said support structure having a top wall shaped to correspond to the shape of the airfoils, and
   each of said receptacles further comprising a cover for closing said open sided support structure.

19. The modular fixture of claim 18 further comprising:
   a first masking device mounted to said top wall for preventing one surface of said airfoil from being coated; and
   a second masking device mounted to said cover for preventing a portion of said airfoil from being coated.

20. The modular fixture of claim 18 further comprising:
   said second masking device preventing the trailing edge portion of said airfoil from being coated.

21. A system for coating workpieces comprising:
   a coating chamber;
   a modular fixture positioned within said coating chamber;
   said modular fixture comprising a tubular core member having an exterior periphery, a longitudinally extending central axis, and means affixed to said exterior periphery for holding said workpieces to be coated during a coating operation; means for rotating said modular fixture about said central axis during said coating operation while said workpieces remain stationary within said holding means;
   means for mounting said modular fixture to said rotating means; and
   said mounting means comprising a cylindrical member projecting from an end of said modular fixture, which member is adapted to receive a shaft driven by said rotating means.

22. The system of claim 21 further comprising means for securing said cylindrical member to said shaft.

23. The system of claim 21 further comprising:
   said shaft having a first portion and a second portion; and
   said second portion being movable relative to said first portion to facilitate loading of said fixture onto said shaft.

24. A method for coating a plurality of workpieces comprising the steps of:
   providing a modular fixture having a plurality of workpiece support structures positioned along its length and about its exterior periphery;
   placing a workpiece to be coated in each of said support structures and securing said workpieces in place;
   securing said modular fixture with said plurality of workpieces to a rotary drive means within a coating chamber;
   subjecting said workpieces to a coating operation; and
   rotating said fixture about its longitudinal axis while maintaining said workpieces stationary within said support structures during said coating operation to effect coating of desired portions of each of said workpieces.

* * * * *